US010068997B1

(12) United States Patent
Preisler

(10) Patent No.: US 10,068,997 B1
(45) Date of Patent: Sep. 4, 2018

(54) SIGE HETEROJUNCTION BIPOLAR TRANSISTOR WITH CRYSTALLINE RAISED BASE ON GERMANIUM ETCH STOP LAYER

(71) Applicant: Newport Fab, LLC, Newport Beach, CA (US)

(72) Inventor: Edward J. Preisler, San Clemente, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 15/627,227

(22) Filed: Jun. 19, 2017

(51) Int. Cl.
*H01L 29/737* (2006.01)
*H01L 29/08* (2006.01)
*H01L 29/66* (2006.01)
*H01L 29/04* (2006.01)
*H01L 21/3065* (2006.01)
(Continued)

(52) U.S. Cl.
CPC .......... *H01L 29/7375* (2013.01); *H01L 29/04* (2013.01); *H01L 29/0817* (2013.01); *H01L 29/66242* (2013.01); *H01L 29/7378* (2013.01); *H01L 21/0262* (2013.01); *H01L 21/02532* (2013.01); *H01L 21/02595* (2013.01); *H01L 21/3065* (2013.01); *H01L 21/30604* (2013.01)

(58) Field of Classification Search
CPC .................. H01L 29/7375; H01L 29/04; H01L 29/66242; H01L 29/0817; H01L 29/7378; H01L 21/02595; H01L 21/0262; H01L 21/02532; H01L 21/30604; H01L 21/3065
See application file for complete search history.

(56) References Cited

U.S. PATENT DOCUMENTS

| 2004/0029355 A1* | 2/2004 | Hara ................. H01L 21/76224 |
| | | 438/435 |
| 2014/0264457 A1* | 9/2014 | Preisler ............... H01L 29/7371 |
| | | 257/197 |
| 2014/0264458 A1 | 9/2014 | Preisler et al. |

(Continued)

OTHER PUBLICATIONS

Vu et al., "Advanced Si/SiGe HBT architecture for 28-nm FD-SOI BiCMOS", IEEE, 2016.

(Continued)

*Primary Examiner* — Selim Ahmed
(74) *Attorney, Agent, or Firm* — Bever, Hoffman & Harms, LLP

(57) ABSTRACT

A thin Ge layer is formed between an SiGe intrinsic base and single-crystal Si extrinsic base structures to greatly simplify the fabrication of raised-base SiGe heterojunction bipolar transistors (HBTs). The fabrication process includes sequentially depositing the SiGe intrinsic base, the Ge, and Si extrinsic base layers as single-crystal structures over a patterned silicon wafer while the wafer is maintained inside a reaction chamber. The Ge layer subsequently functions as an etch stop, and protects the crystallinity of the underlying SiGe intrinsic base material during subsequent dry etching of the Si extrinsic base layer, which is performed to generate an emitter window. A wet etch then removes residual Ge from the emitter window to expose a contact portion of the SiGe layer surface without damage. A polysilicon emitter structure is formed in the emitter window, and then salicide is formed over the base stacks to encapsulate the SiGe and Ge structures.

14 Claims, 6 Drawing Sheets

(51) Int. Cl.
*H01L 21/306* (2006.01)
*H01L 21/02* (2006.01)

(56) References Cited

U.S. PATENT DOCUMENTS

2014/0353725 A1* 12/2014 Adkisson .............. H01L 29/737
257/197
2015/0303187 A1 10/2015 Preisler et al.

OTHER PUBLICATIONS

Fox et al., "SiGe:C HBT Architecture with Epitaxial External Base", IEEE BCTM 4.3, 2011.

* cited by examiner

SIGE HETEROJUNCTION BIPOLAR TRANSISTOR WITH CRYSTALLINE RAISED BASE ON GERMANIUM ETCH STOP LAYER

FIELD OF THE INVENTION

This invention relates to semiconductor-based integrated circuits, and more particularly to heterojunction bipolar transistors.

BACKGROUND OF THE INVENTION

Bipolar transistors are electronic elements having three device regions: an emitter, a collector, and a base disposed between the emitter and the collector. If the emitter and collector are formed using n-type dopants (n-doped) and the base is formed using p-type dopants (p-doped), then the element is an "npn" bipolar transistor. Conversely, if the emitter and collector are n-doped and the base is p-doped, the element is an "npn" bipolar transistor. Because electron mobility in the base region of npn transistors is higher than that of holes in the base of pnp transistors, npn transistors exhibit higher-frequency operation and higher-speed performances than pnp transistors.

A heterojunction bipolar transistor (HBT) is a type of bipolar junction transistor (BJT) in which the emitter and base regions are formed using crystalline semiconductor materials having different band gaps, whereby the interface between the different materials creates a heterojunction. References to SiGe HBTs herein are to npn-type HBTs in which the heterojunction is typically generated by forming a highly n-doped Si emitter structure on an SiGe base structure, which in turn is formed on an n-doped silicon substrate-based collector. SiGe HBTs may also be fabricated as pnp-type HBTs as well. SiGe HBTs are commonly used in modern communication circuits (e.g., radio-frequency (RF) power amplifiers used in cellular phones) because of their ability to handle high frequencies (i.e., up to several hundred GHz) with relatively low power consumption (i.e., in comparison to CMOS switches configured to achieve the same level of performance).

As semiconductor devices continue to decrease in size, optimal device operation becomes more difficult to achieve. For example, when scaling advanced SiGe HBTs two factors are of primary importance: 1) scaling the vertical emitter-base-collector dimension to improve cutoff frequency ($F_t$) and DC current gain ($\beta$), and 2) scaling the lateral dimension of the bipolar transistor to improve the maximum frequency of unity power gain ($F_{max}$) and the RF noise figure ($Nf_{min}$). In SiGe HBTs, lateral scaling has typically focused on reducing the parasitic extrinsic base resistance (Rbx) and extrinsic base-collector capacitance ($C_{BC}$).

State-of-the-art SiGe HBTs are configured using raised base techniques, which were not used in earlier HBTs. The raised base techniques include a raised extrinsic base region that serves to improve the fundamental tradeoff between base resistance and collector-base capacitance by separating the extrinsic base region from the intrinsic base growth. In a typical raised base scheme the raised extrinsic base material is Si, and is typically implemented using polycrystalline Si (polysilicon). However, conventional raised-base techniques utilize processes requiring separate deposition steps for creating an epitaxially grown extrinsic base region that connects the single-crystal intrinsic base region to the base contact. Consequently, fabrication of a silicon raised base often significantly increases manufacturing costs, and requires high temperature processing, and is accompanied by difficulty in etching and forming the silicon raised base due to low etchant selectivity during fabrication.

What is needed is a raised-based SiGe HBT having the enhanced performance characteristics provided by single-crystal extrinsic base structures, but can be fabricated in a way that avoids the difficulties encountered by conventional approaches.

SUMMARY OF THE INVENTION

The present invention is directed to raised-base SiGe HBTs characterized by the presence of thin, substantially pure Ge layer portions disposed between Si extrinsic base structures and corresponding SiGe intrinsic base structure portions. In one embodiment the substantially pure Ge layer portions are formed as single-crystal structures, have a Ge concentration in the range of 95% to 100%, and have a thickness in the range of 2 nanometers (nm) and 100 nm. The formation of these additional Ge layer portions is easily incorporated into existing SiGe HBT fabrication processes with minimal changes, and their presence greatly simplifies the subsequent formation of single-crystal, highly doped Si extrinsic base structures while avoiding the high temperature processing and selective etching issues associated with conventional methods. Accordingly, raised-base SiGe HBTs produced in accordance with the present invention achieve the superior operating characteristics of SiGe HBTs having single-crystal intrinsic base structures (i.e., in comparison to HBTs including polysilicon-type extrinsic base structures), and are less expensive to produce (i.e., have a lower overall manufacturing cost) than conventional SiGe HBTs with single-crystal intrinsic base structures.

According to a presently preferred embodiment, SiGe HBTs formed in accordance with the present invention are further characterized by oxide-based dielectric structures disposed between the substantially pure Ge layer portions and a lower (contact) portion of the polysilicon emitter structure, and by salicide structures formed over the base stacks. Like the Ge layer portions and the lower emitter structure portion, the oxide-based dielectric structures are disposed directly on an upper surface of the SiGe intrinsic base structure, and extend from overhang regions formed under portions of the Si extrinsic base structures to regions under nitride or α-Si spacer structures that abut side edges of the polysilicon emitter structure. By providing the oxide-based dielectric structures in this manner, the emitter structure is reliably separated from the Si intrinsic base structures, thereby ensuring reliable and optimal HBT operation. The salicide structures formed on the base stacks are configured to function both as base linking structures (i.e., the silicide electrically connects each extrinsic Si base structure to its corresponding SiGe intrinsic base portion), and also to encapsulate the SiGe and substantially pure Ge base materials (i.e., to avoid fabrication issues associated with non-encapsulated materials including Ge). In an exemplary embodiment, each salicide structure is formed such that it extends as a continuous layer between the side edge of an underlying Si extrinsic base structure and the side edge of a corresponding SiGe intrinsic base structure portion, thereby covering the side edge of the intervening substantially pure Ge layer portion. By encapsulating the base stacks in salicide in this manner, the only surfaces of the SiGe HBT that are exposed at the end of the fabrication method described above are regular (undoped) silicon and salicide, thereby avoiding process complications associated with the exposure of Ge.

The present invention is also directed to a modified fabrication method used to fabricate SiGe HBTs that utilize a substantially pure Ge layer to integrate the deposition of both a SiGe intrinsic base layer and highly-doped single crystal Si extrinsic base layer, thereby providing the performance advantages of single-crystal Si extrinsic base structures while avoiding the complicated fabrication process required by conventional approaches. According to an aspect of the invention, the SiGe intrinsic base layer, the intervening Ge layer, and the Si extrinsic base layer are sequentially formed while the underlying wafer/substrate is maintained in a reaction chamber. According to an aspect of the invention, the sequential formation of the SiGe layer, the Ge layer and the Si layer is performed such that all three layers comprise single-crystal structures. Specifically, forming the SiGe layer on a single-crystal base facilitates formation of the SiGe layer as a single-crystal, which in turn facilitates growing the subsequently formed Ge and Si layers as single crystals. Due to the large lattice mismatch of single-crystal Ge to single-crystal Si, the Ge and Si layers may be somewhat defective, but still formed as single crystals, and their crystal defects will be irrelevant for the purpose of forming the highly conductive Si layer, which is used to form the extrinsic base portion of the SiGe HBT device). In an exemplary embodiment, the same source gases (e.g. $SiH_4$-based Silicon growth, $SiH_4$/$GeH_4$-based SiGe growth and $GeH_4$-based Germanium growth) are supplied in combination into the reaction chamber during formation of the SiGe layer, and then supplied individually during subsequent time periods during formation of the substantially pure Ge layer and the single-crystal Si layer. By forming both the intrinsic base material (i.e., the SiGe layer) and the extrinsic base material (i.e., the Si layer) while maintaining the wafer/substrate in a single reaction chamber, the present invention facilitates a greatly simplified (i.e., in comparison to conventional approaches) method for fabricating SiGe HBTs having raised Si extrinsic base regions. Moreover, as explained in additional detail below, the fabrication method of the present invention may be implemented using an existing SiGe fabrication flow without additional process steps and materials, and without introducing a significant change to the existing flow's thermal budget. By way of contrast, in all conventional raised-base implementations, multiple epitaxial or furnace growths are necessary, each of which adds significant thermal budget and processing steps to the fabrication flow.

Subsequent to forming the base (epitaxial growth) stack (i.e., the single-crystal SiGe, Ge and Si layers), an emitter window is formed by way of dry etching (removing) a portion of the Si layer using the substantially pure Ge layer as an etch stop. In a preferred embodiment, an oxide-based dielectric layer and a nitride-based dielectric layer, which are needed for inside spacer integration (i.e., to isolate the emitter polysilicon from the extrinsic base), are sequentially formed over the Si layer before the dry etching process. An emitter window mask is then patterned over oxide/nitride stack, and a dry etching process (e.g., RIE) is then utilized to remove portions of the Si layer, along with corresponding overlying portions of said oxide-based dielectric layer and said nitride-based dielectric layer. According to an aspect of the invention, the thin Ge layer is configured such that it serves as an etch stop layer, and also functions to protect the crystallinity of the underlying SiGe intrinsic base material during the dry etching process.

Subsequent exposure of the underlying SiGe layer through the emitter window is then achieved by removing the exposed Ge layer material using a wet etching process. In a preferred embodiment, the wet etchant is $H_2O_2$, which effectively removes all of the exposed Ge material without damaging the underlying SiGe intrinsic base material.

A polycrystalline silicon (polysilicon) emitter structure is then formed in and over the emitter window such that a lower "contact" portion of the polysilicon emitter structure abuts a contact portion of the SiGe layer, which is exposed on the bottom of the emitter window. In an exemplary embodiment, to prepare the emitter window for the polysilicon deposition, oxide and nitride (or amorphous silicon (α-Si)) spacer materials are disposed in and around the emitter window and then the nitride (or amorphous silicon) is etched using an anisotropic etch, forming a dielectric spacer on the sides of the extrinsic base in the emitter window opening. Then, to re-expose the contact portion of the SiGe layer, a wet etch (usually hydrofluoric acid-based) is used to remove the final oxide layer. Polycrystalline material is then deposited and patterned in and over the emitter window in a form defined by the patterned spacer material to finalize the polysilicon emitter structure.

The HBT fabrication process is then completed by way of performing a base stack etch, salicide formation, and then back-end metallization. The base stack etch involves forming a base stack mask and then utilizing a suitable etchant to remove unused portions of the intrinsic and extrinsic base material layers, thereby forming the final base stack structures (i.e., the intrinsic and extrinsic base structures). Salicide structures are then formed on the base stacks and the emitter structure, with the base stack salicide structures being configured to function both as base linking structures and also to encapsulate the Ge-based materials (i.e., the SiGe intrinsic base structure and the Ge layer portions) in order to avoid Ge-based fabrication issues. Back-end metallization (not illustrated) is then performed to provide necessary signal connections to the emitter, base and collector structures.

As set forth above, the addition of a thin, pure or substantially pure Ge layer between the SiGe intrinsic base layer and the Si extrinsic base layer provides several advantages over conventional HBT fabrication processes. First, forming the substantially pure Ge layer between the SiGe base layer and the Si extrinsic base layer facilitates generating the base stack using a single-step process (i.e., while maintaining the underlying wafer/substrate in one reactor chamber), thereby greatly simplifying the base stack deposition process by way of facilitating the use of only one low temperature pre-bake during formation of the epitaxial layers. Second, forming the Ge layer as a single-crystal structure facilitates the reliable subsequent formation of the Si extrinsic base layer as a single-crystal structure, which provides the resulting SiGe HBT with superior operating characteristics of over polysilicon-base HBTs. Third, the Ge layer functions both as an etch stop during the dry etching process utilized to form the emitter window, and also serves as a barrier to protect the crystallinity of the SiGe intrinsic base layer during this dry etching process. Fourth, the exposed Ge etch-stop material is easily and gently removed from the emitter window using a suitable wet etchant (e.g., $H_2O_2$), thereby reliably exposing the intrinsic base for contact by the emitter structure without damage. Fifth, the residual sections of the Ge layer are reliably entirely encapsulated (along with exposed surfaces of the SiGe intrinsic base structure) by way of salicide structures, thereby avoiding processing complications associated with exposed Ge-containing materials. Therefore, forming the Ge layer between the SiGe intrinsic base layer and the Si extrinsic base layer facilitates the low-cost production of superior SiGe HBTs with minimal modifications to an existing HBT processing flows (i.e., the modified fabrication method requires no additional processing steps, requires no additional thermal budget, requires no additional HF cleaning steps, and leaves only exposed Si surfaces after salicide formation).

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in methods for fabricating raised-base SiGe HBTs, and to SiGe HBTs produced in accordance with the methods. The following description is presented to enable one of ordinary skill in the art to make and use the invention as provided in the context of a particular application and its requirements. As used herein, directional terms such as "upper", "upward", "lower" and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
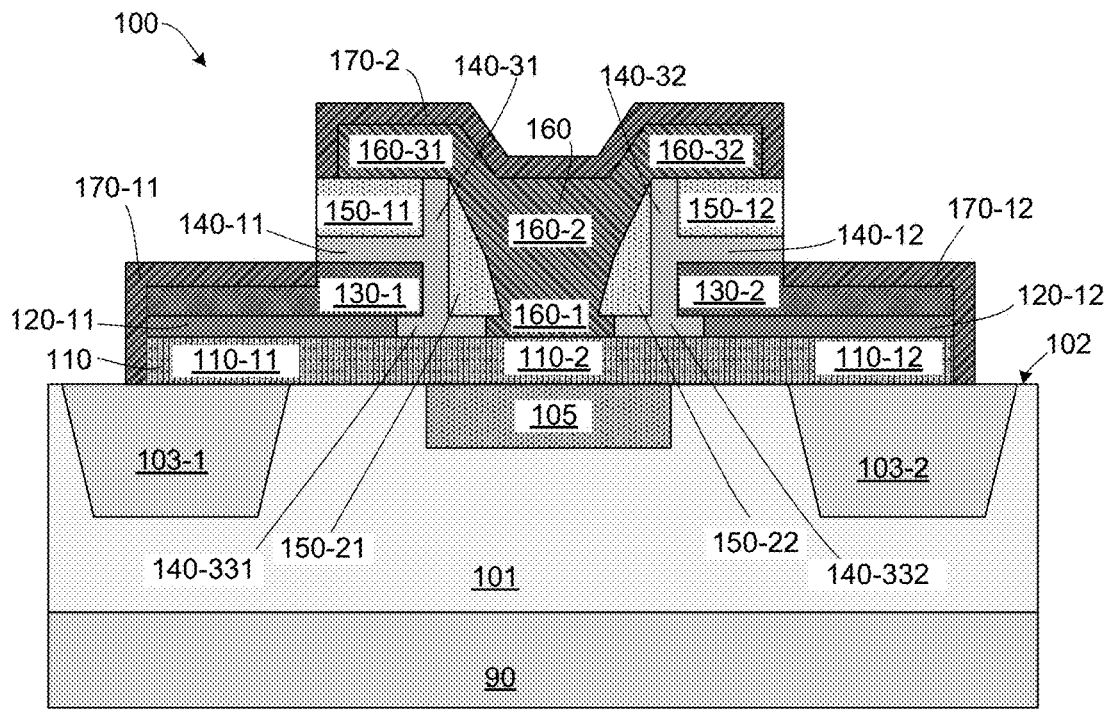
FIG. 1 is a cross-sectional side view showing an SiGe HBT according to an exemplary embodiment of the present invention.

FIG. 1 is a cross-sectional view showing an exemplary raised-base SiGe HBT 100 produced in accordance with an exemplary embodiment of the present invention. HBT 100 is fabricated on a semiconductor substrate 101 (e.g., per standard SiGe BiCMOS processing techniques, a low-doped n-type epitaxial silicon grown on top of a p-type monocrystalline silicon substrate 90) that has been processed to include therein isolation structures (e.g., shallow-trench isolation) 103-1 and 103-2. Similar to conventional HBT's, HBT 100 includes a base stack made up of an SiGe intrinsic base structure 110 disposed on an upper surface 102 of substrate 101, p-doped Si extrinsic base structures 130-11 and 130-12 respectively disposed over corresponding first portions 110-11 and 110-12 of intrinsic base structure 110, an n-doped polysilicon emitter structure 160 that extends through an opening between extrinsic base structures 130-11 and 130-12 and contacts a centrally located (second) portion 110-2 of intrinsic base structure 110, and an n-doped collector region 105 diffused into substrate 101 below centrally located portion 110-2 of intrinsic base structure 110. Various oxide layers and nitride or α-Si spacer depositions combine to isolate emitter structure 160 from extrinsic base structures 130-11 and 130-12. Specifically, oxide portions 140-11, 140-31 and 140-331 and spacer depositions 150-11 and 15-21 combine to isolate emitter structure 160 from extrinsic base structure 130-11, and oxide portions 140-12, 140-32 and 140-332 and spacer depositions 150-12 and 15-22 combine to isolate emitter structure 160 from extrinsic base structure 130-12. The formation of these oxide layers and nitride/α-Si spacer depositions is explained below. Emitter structure 160 is a Y-shaped polysilicon structure having a lower (contact) portion 160-1 that contacts centrally located portion 110-2 of intrinsic base structure 110, a central (body) portion 160-2 that extends upward from contact portion 160-1 inside an emitter window region, and upper portions 160-31 and 160-32 that extend outward from body portion 160-2 over spacer depositions 150-12 and 15-22. Note that oxide-based dielectric structures 140-331 and 140-332 are disposed respectively disposed between Ge layer portions 120-11 and 120-12 and contact portion 160-1 of polysilicon emitter structure 160. Like Ge layer portions 120-11 and 120-12, which are formed over corresponding first intrinsic base structure portions 110-11 and 110-12, and lower emitter structure portion 160-1, which contacts centrally located intrinsic base portion 110-2, oxide-based dielectric structures 140-331 and 140-332 are disposed directly on the upper surface of SiGe intrinsic base structure 110, and extend from overhang regions formed under inner edge portions of Si extrinsic base structures 130-11 and 130-12 to regions disposed under nitride/α-Si spacer structures 150-21 and 150-22.

According to an aspect of the invention, thin, substantially pure Ge layer portions 120-11 and 120-12 are respectively sandwiched between each Si extrinsic base structure 130-11 and 130-12 and its corresponding SiGe intrinsic base structure portion 110-11 and 110-12. Specifically, Ge layer portion 120-11 is disposed between Si extrinsic base structure 130-11 and corresponding SiGe intrinsic base structure portion 110-11, and Ge layer portion 120-12 is disposed between Si extrinsic base structure 130-12 and corresponding SiGe intrinsic base structure portion 110-12. The base stack is preferably fabricated using the modified fabrication method described below, whereby each of SiGe intrinsic base structure 110, substantially pure Ge layer portions 120-11 and 120-12 and Si extrinsic base structure 130-11 and 130-12 are respectively formed as single-crystal structures.

According to a presently preferred embodiment, SiGe HBT 100 further includes (first) salicide structures 170-11 and 170-12 formed over the base stacks, and a (second) salicide structure 170-2 formed over polysilicon emitter structure 160. Salicide structure 170-11 is fabricated using known techniques such that it covers the exposed upper surface of Si extrinsic base structure 130-11 and extends as a continuous layer over the side edges of the base stack (i.e., such that completely covers the side edges of Si extrinsic base structure 130-11, corresponding SiGe intrinsic base structure portion 110-11, and intervening substantially pure Ge layer portion 120-11). Similarly, salicide structure 170-12 extends as a continuous layer over the exposed upper surface of Si extrinsic base structure 130-12 and down the side edges of Si extrinsic base structure 130-12, corresponding SiGe intrinsic base structure portion 110-12, and intervening substantially pure Ge layer portion 120-12. By covering all exposed surfaces of the base stack, salicide structures 170-11 and 170-12 function to encapsulate all materials including Ge. In addition, by extending between the side edges of the corresponding intrinsic and extrinsic base structures, salicide structures 170-11 and 170-12 also serve as base linking structures that electrically connect the corresponding intrinsic and extrinsic base structures. As indicated in FIG. 1, salicide structure 170-2 extends over the entire upper surface of polysilicon emitter structure 160 and down the side edges of upper portions 160-31 and 160-32, but is separated from salicide structures 170-11 and 170-12 due to the presence of spacer depositions 150-12 and 150-22, respectively, and oxide portions 140-11 and 140-12, respectively.

Figure 2:
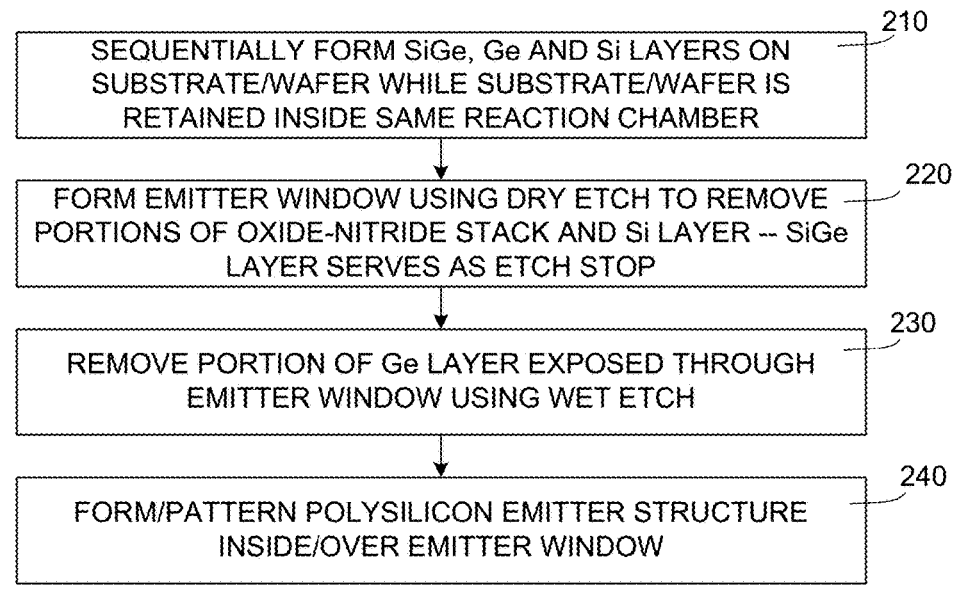
FIG. 2 is a flow diagram depicting a simplified fabrication method for producing the SiGe HBT of FIG. 1 according to another embodiment of the present invention.

FIG. 2 is a flow diagram showing a simplified fabrication method for fabricating a raised-base SiGe HBT, such as HBT 100 (shown in FIG. 1), where each block identifies one or more fabrication processes that are performed in the sequential order indicated by the diagram flow. Referring to the top of FIG. 2 and proceeding downward, block 210 includes sequentially forming a SiGe layer, a substantially pure Ge layer, and an Si layer on a semiconductor (e.g., silicon) substrate, block 220 forming an emitter window by way of dry etching (removing) a portion of the Si layer using the Ge layer as an etch stop, block 230 includes utilizing a wet etch to remove the portion the Ge layer that was exposed inside the emitter window by the dry etch process, and block 240 includes forming a polysilicon emitter structure in and over the emitter window such that a lower portion of the emitter structure abuts a contact portion of the SiGe layer that was exposed during the wet etch. The simplified fabrication process shown in FIG. 2 is not intended to describe all process steps necessarily required to produce the novel SiGe HBTs, but merely depicts the main novel processes and sequences utilized in accordance with novel aspects of the present invention.

Figure 3A:
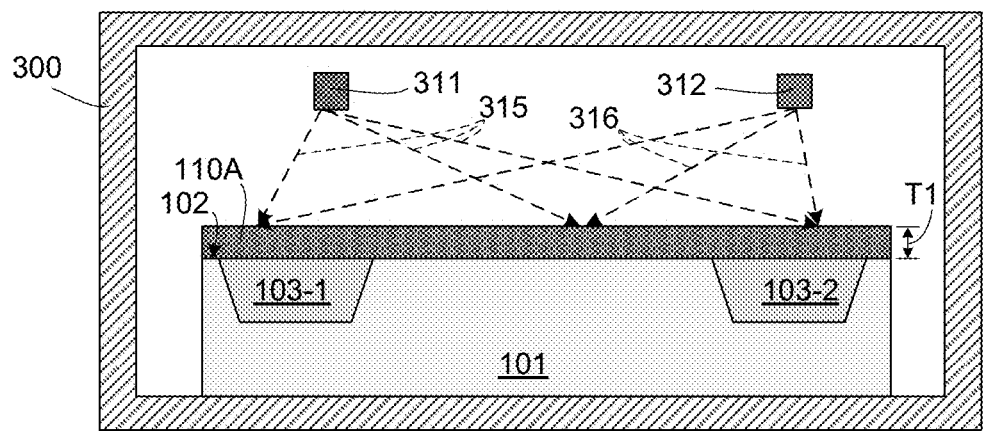
FIGS. 3(A), 3(B), 3(C), 3(D), 3(E), 3(F), 3(G), 3(H), 3(I), 3(J), 3(K), 3(K), 3(L) and 3(M) are cross-sectional side views showing the fabrication process of FIG. 2 in additional detail.
Figure 3B:
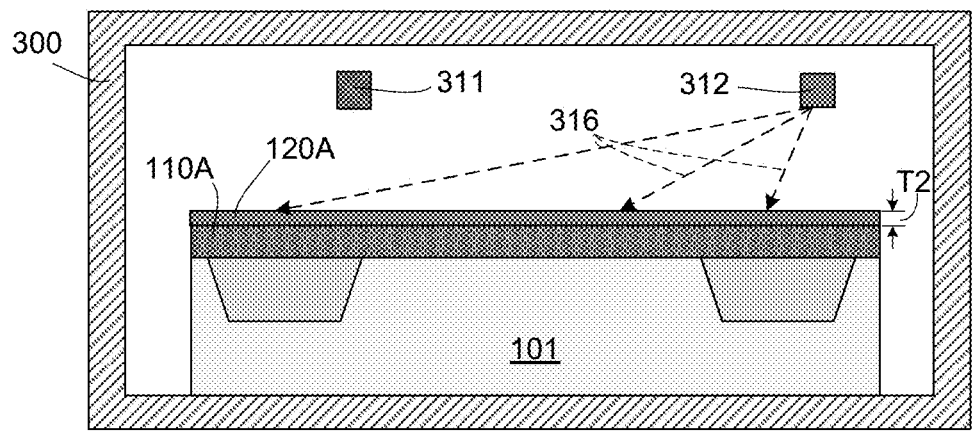
Figure 3C:
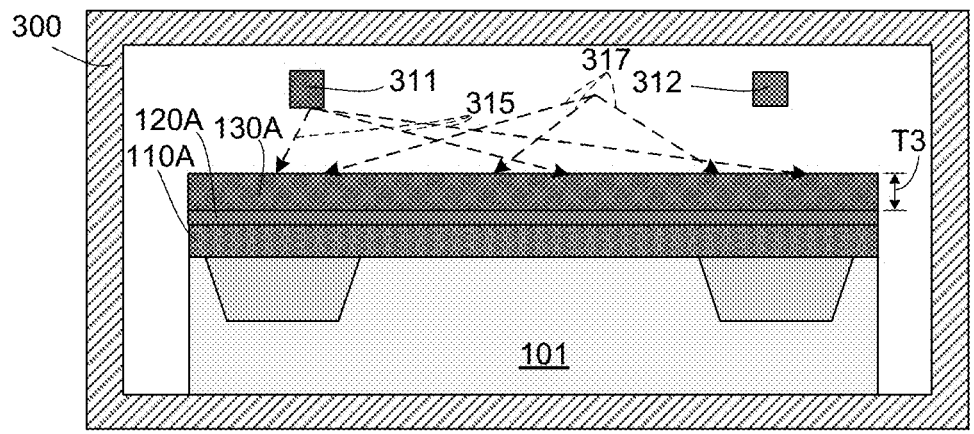
Figure 3D:
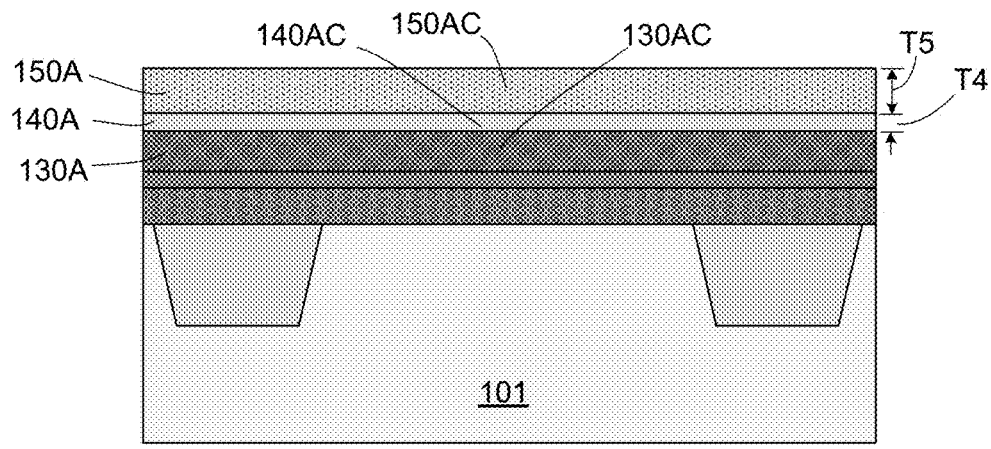
Figure 3E:
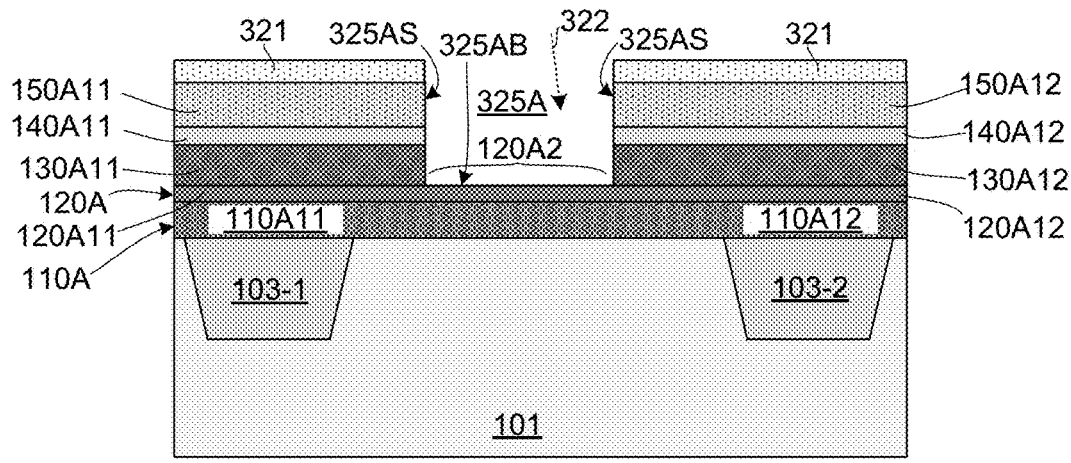
Figure 3F:
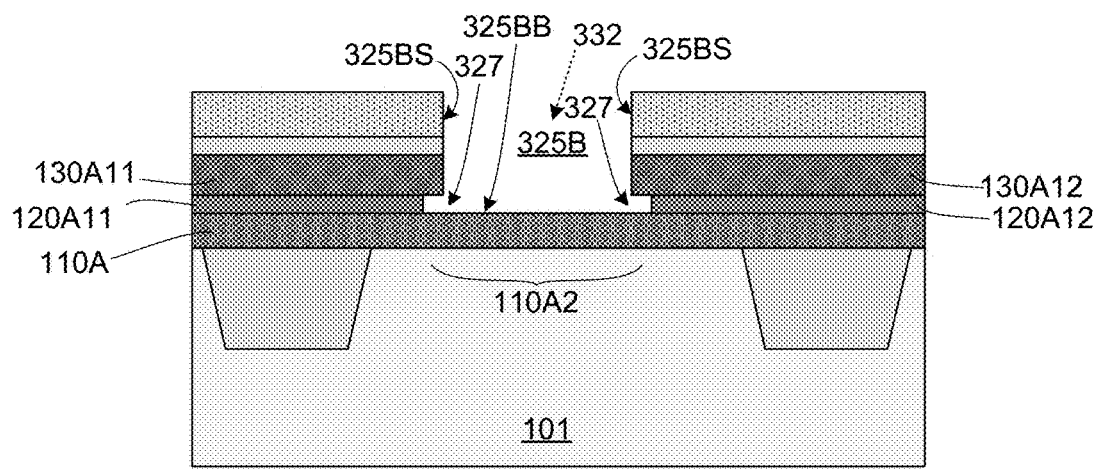

A presently preferred exemplary embodiment implementing the simplified embodiment of FIG. 2 will now be described with reference to FIGS. 3(A) to 3(M), where FIGS. 3(A) to 3(C) depict the sequential formation of SiGe, Ge and Si layers, FIG. 3(E) depicts the formation of an emitter window, FIG. 3(F) depicts the wet etch utilized to remove exposed Ge material, and FIGS. 3(G) to 3(M) depict the subsequent formation and patterning of a polysilicon emitter structure. Additional processes and features of the exemplary embodiment are described below with specific reference to the associated FIGS. 3(A) to 3(M).

FIG. 3(A) illustrates a first stage of the fabrication process in which an SiGe layer 110A, which will eventually serve as the intrinsic base layer, is formed on an upper wafer surface 102 of a patterned silicon wafer (substrate) 101 that has been operably placed inside an epitaxial growth reaction chamber 300. In one embodiment wafer 101 is a single crystal silicon substrate that has been processed according to known non-selective SiGe HBT fabrication techniques before the formation of SiGe layer 110A (e.g., wafer 101 is processed to include spaced-apart shallow-trench isolation structures 103-1 and 103-2 prior to being placed inside reaction chamber 300). In the exemplary embodiment, wafer 101 comprises epitaxial single-crystal Si having an n-type doping concentration in the range of $1\times10^{14}$ to $1\times10^{17}$ atoms per cubic centimeter, and SiGe layer 110A comprises p-type SiGe of varying Germanium composition grown to a thickness T1 in the range of 50 nm to 150 nm on wafer surface 102 using appropriate source gasses (e.g., $SiH_4$ gas 315 and $GeH_4$ gas 316) whose flow into reaction chamber 300 is controlled by way of source gas control mechanisms 311 and 312 using known techniques such that a varying ratio of Si to Ge is in the range of 0 to 35 atomic % Germanium. Typical state-of-the-art SiGe HBTs use SiGe profiles which vary from 0% Germanium up to as high as 35% over the course of a 50-150 nm total width for the entire SiGe HBT base profile. Any SiGe growth in this range should be acceptable for the function described herein.

According to an aspect of the present invention, wafer 101 is retained inside chamber 300 after formation of SiGe layer 110A is completed, and is maintained inside reaction chamber 300 until after a single crystal Si extrinsic base material is formed over SiGe intrinsic base layer 110A (described below with reference to 3(C)). That is, typical conventional SiGe HBT fabrication techniques typically involve removing the wafer from the epitaxial growth reactor, and subsequent processing is performed using suitable deposition equipment. In the novel integration flow, wafer 101 remains in reactor chamber 300 after growth of SiGe layer 110A is completed for generation of a substantially pure Ge layer and a single-crystal Si layer as described below.

FIG. 3(B) illustrates substrate 101 at a time period subsequent to that shown in FIG. 3(A) (i.e., after deposition of SiGe layer 110A). While still in reaction chamber 300, a substantially pure Ge layer (i.e., either 100% pure Ge or a high concentration of $Ge_xSi_{1-x}$, where x is greater than 0.95). In the exemplary embodiment, Ge layer 120A is grown to a thickness T2 in the range of 2 nm to 100 nm using at least one of the source gasses (e.g., $SiH_2Cl_2$ or $SiH_4$ gas and/or $GeH_4$ gas). For example, pure Ge may be formed by way of turning off (closing) gas control mechanism 311 and turning on (opening) gas control mechanism 312 such that only $GeH_4$ gas 316 is admitted into reaction chamber 300 during formation of Ge layer 120A. This invention does not depend on a specific manner of growth for the material stack shown in FIG. 3C, only that the resulting stack consists of the combination of materials shown. Several different techniques might be used to create this stack, ranging from Molecular Beam Epitaxy (MBE), to Ultra-High-Vacuum Chemical Vapor Deposition (UHV-CVD), to Hydride Phase Chemical Vapor Deposition (HP-CVD) or a combination thereof. The key points are that the stack is grown as a single-crystal in region 110-2 in FIG. 1, and that the stoichiometry of the layers in FIG. 3C are: layer 110A consists essentially of $Si_xGe_{1-x}$ where X>0.2, layer 120A consists essentially of $Ge_xSi_{1-x}$ where x>0.95, and layer 130A consists essentially of $Si_xGe_{1-x}$ where x>0.2.

FIG. 3(C) illustrates substrate 101 at a time period subsequent to that shown in FIG. 3(B). While still in reaction chamber 300, a highly doped Si layer (e.g., Si doped with Boron having a concentration in the range of $1\times10^{18}$ to $1\times10^{20}$ atoms per cubic centimeter ($cm^3$)) is formed on Ge layer 120A. In the exemplary embodiment, Si layer 130A is grown to a thickness T2 in the range of 20 nm to 100 nm using at least the silicon-based source gas that was used to generate SiGe layer 110A. For example, Si layer 130A may be formed by way of turning off gas control mechanism 312 and turning on (opening) gas control mechanism 311 such that $SiH_2Cl_2$ or $SiH_4$ gas 315 is admitted into chamber 300, along with a dopant-source gas 317 (e.g., $B_2H_6$) during formation of Si extrinsic base layer 130A. Wherever SiGe layer 110A was deposited epitaxially (i.e., as a single crystal), Ge layer 120A and Si layer 130A will also grow as a single crystal. Due to the large lattice mismatch of Ge to Si, thin Ge layer 120A and Si layer 130A will be somewhat defective, but still a single crystal, and the defectivity will be irrelevant for the purpose of forming the highly conductive extrinsic base portion of the HBT.

FIG. 3(D) shows substrate 101 after completing the formation of the base layer (SiGe/Ge/Si) stack. Note that substrate 101 is shown as being removed from the reaction chamber, and it is understood substrate 101 is now located in a second deposition equipment chamber (not shown) suitable for the subsequent processing described below. According to the preferred exemplary embodiment, an oxide/nitride stack, which is needed for subsequent inside spacer integration (i.e., to isolate the emitter from the base), is then formed over the SiGe/Ge/Si stack. As indicated in FIG. 3(D), the oxide/nitride stack is generated by depositing or otherwise forming an oxide-based dielectric layer 140A having a thickness T4 in the range of 2 nm to 100 nm Si extrinsic base layer 130A, and then forming a nitride-based dielectric layer 150A having a thickness T5 in the range of 10 nm to 100 nm on oxide-based dielectric layer 140A. In one embodiment, a shallow implant may be added between oxide-based dielectric layer 140A and nitride-based dielectric layer 150A to add to the silicon doping of Si layer 130A.

FIG. 3(E) depicts an exemplary formation of an emitter window 325A by way of dry etching portion 130AC of Si extrinsic base layer 130A (shown in FIG. 3(D)) in a manner that utilizes Ge layer 120A as an etch stop. First, an emitter window mask 321 is then patterned over the oxide/nitride stack (i.e., on nitride-based dielectric layer 150A), and a dry etching process (indicated by arrows 332) is then utilized according to well-known techniques to remove portion 130AC of Si layer 130A, along with corresponding portion 140AC (shown in FIG. 3(D)) of oxide-based dielectric layer 140A and corresponding portion 150AC (shown in FIG. 3(D)) of nitride-based dielectric layer 150A. In one embodiment, the dry etching process utilizes reactive ion etching (RIE) with a well-known chemistry tailored to etch silicon in a highly selective manner relative to pure Ge, wherein the Ge layer also serves to protect the crystallinity of SiGe intrinsic base layer 110A during the RIE dry etching process. Accordingly, the formation of substantially pure Ge layer 120A between SiGe intrinsic base layer 110A and Si extrinsic base layer 130A is advantageous at least because the formation of substantially pure Ge layer 120A as a single crystal structure can be seamlessly integrated into the base stack formation process, and because underlying portion 120A2 of substantially pure Ge layer 120A functions as the etch stop for the dry etching process, and also serves to protect the crystallinity of SiGe intrinsic base layer 110A.

As indicated in FIG. 3(E), the dry etching process patterns emitter window 325A such that its side walls 325AS are formed by exposed side edges several etched-through layer portions, and its bottom surface 325AB is formed by portion 120A2 of Ge layer 120A, which is exposed at the end of the dry etching process. That is, the dry etch functions to separate Si extrinsic base layer 130A into two Si layer portions 130A11 and 130A12 whose side edges form lower portions of side walls 325AS and face each other across emitter window 325A. Note that first Si layer portion 130A1 is formed on a Ge layer portion 120A11 and located over a corresponding portion (region) 110A11 of SiGe intrinsic base layer 110A, and second Si layer portion 130A2 is formed on a Ge layer portion 120A12 and located over a corresponding portion 110A12 of SiGe intrinsic base layer 110A. The dry etching also separates oxide-based dielectric layer 140A into oxide layer portions 140A11 and 140A12 that are respectively disposed over Si layer portions 130A11 and 130A12, and separates nitride-based dielectric layer 150A into nitride layer portions 150A11 and 150A12 that are respectively disposed over oxide layer portions 140A11 and 140A12. As mentioned above, the dry etch process is prevented from passing into SiGe intrinsic base layer 110A by portion 120A2 of Ge layer 120A, which forms bottom wall 325AB of emitter window 325A at the end of the dry etching process.

FIG. 3(F) depicts modified emitter window 325B after a wet etchant 332 is utilized to remove portion 120A2 of substantially pure Ge layer 120A (shown in FIG. 3(E)), thereby exposing a contact portion 110A2 of SiGe layer 110A. Another advantage to utilizing substantially pure Ge as an etch stop material is that it is easily and entirely removable using wet etchants such as those used to remove $SiO_2$ from Si. According to a presently preferred embodiment, $H_2O_2$ is utilized as wet etchant 332 to gently entirely remove the Ge material disposed above the SiGe interface (i.e., above contact portion 110A2). While removing Ge layer portion 120A2, the wet etching process further modifies emitter window 325B by way of forming overhang regions 327 that extend under the edges of Si layer portions 130A11 and 130A12 that form the lower portion of emitter window side edges 325BS.

Figure 3G:
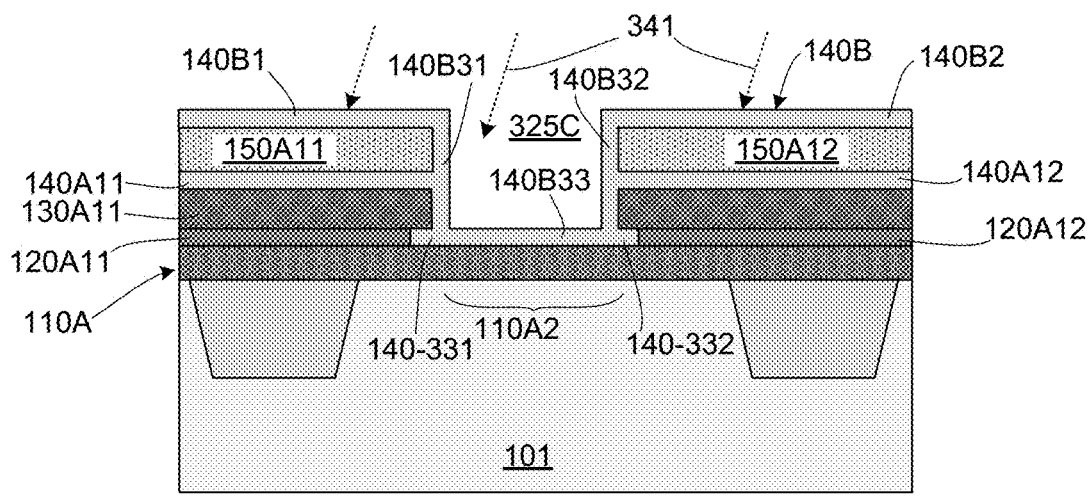
Figure 3H:
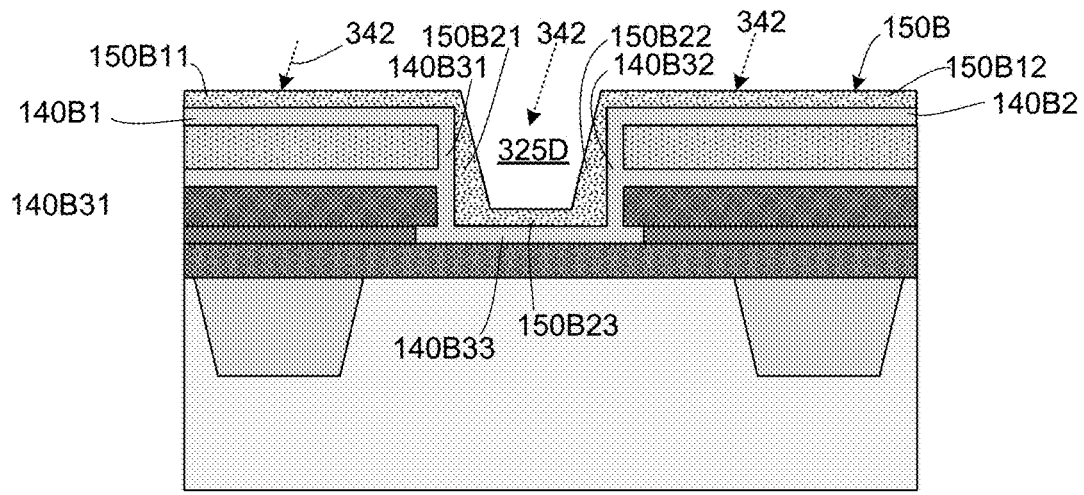
Figure 3I:
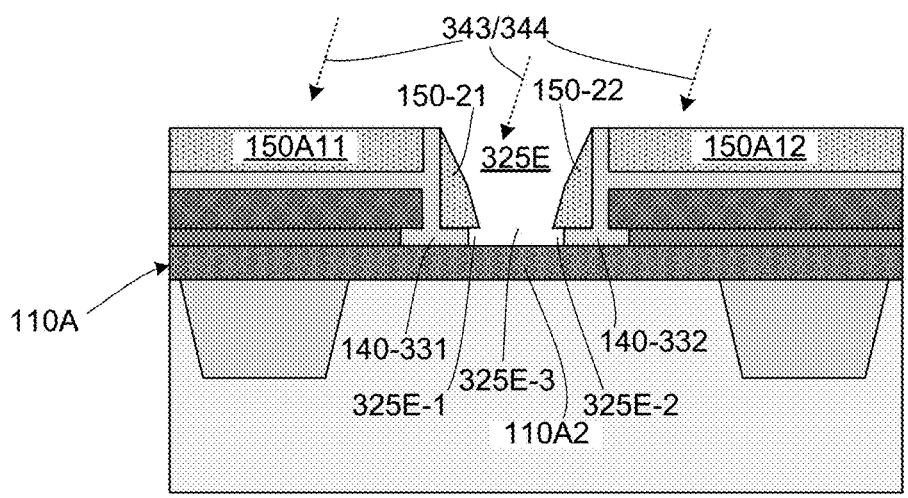
Figure 3J:
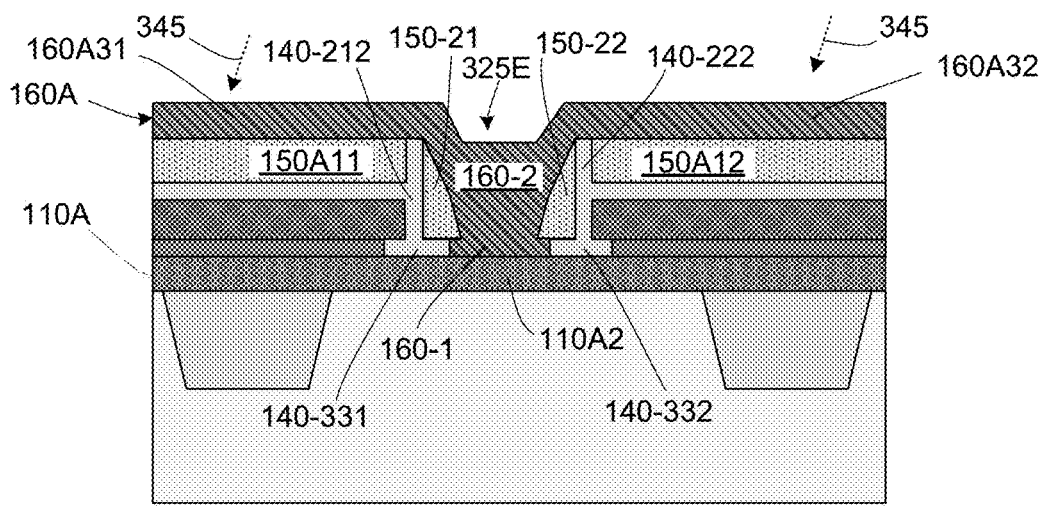
Figure 3K:
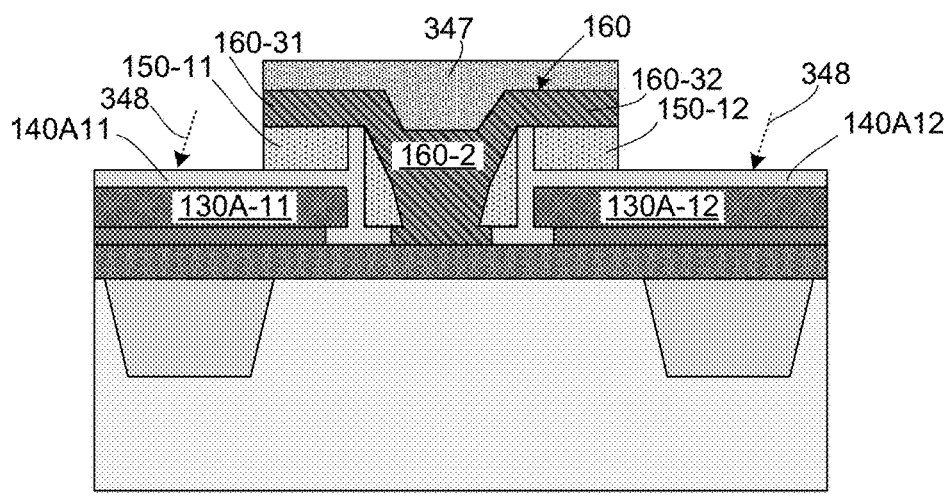

FIGS. 3(G) to 3(K) depict the formation of a polycrystalline silicon emitter structure 160 according to an exemplary embodiment, where FIGS. 3(G) to 3(I) depict the deposition and patterning of oxide and nitride (or α-Si) spacer materials inside the emitter window, FIGS. 3(J) and 3(K) depict the deposition and patterning of polycrystalline material in and over the emitter window.

Referring to FIG. 3(G), an oxide-based dielectric material 341 is deposited such that it forms an oxide layer 140B on the exposed surfaces of substrate 101. Specifically, a first portion 140B1 of oxide layer 140B forms an oxide layer portion 140B1 over nitride layer portion 150A11, and a second portion 140B2 of oxide layer 140B forms an oxide layer portion 140B2 over nitride layer portion 150A12. Inside emitter window 325C, oxide layer 140B forms side wall portions 140B31 and 140B32 on opposing side walls 325CS, and forms a lower oxide layer portion 140B33 on contact portion 110A2 of SiGe intrinsic base layer 110A. That is, side wall portion 140B31 covers inside edge surfaces of nitride layer portion 150A11, oxide layer portion 140A1 and Si extrinsic base layer portion 130A1, and side wall portion 140B32 covers inside edge surfaces of nitride layer portion 150A12, oxide layer portion 140A2 and Si extrinsic base layer portion 130A2. Lower oxide layer portion 140B33 is formed such that portions 140B331 and 140B332 respectively fill overhang regions 327 (shown in FIG. 3(F)), which are located under inner edge surfaces of extrinsic base layer portions 130-11 and 130-12, respectively.

FIG. 3(H) depicts an exemplary deposition of a space material 342 (e.g., either a nitride-based spacer material an α-Si spacer material) on the various oxide layer portions disposed inside and around emitter window 325D. Specifically, the deposited spacer material forms spacer layer portions 150B11 and 150B12 over oxide layer portions 140B1 and 140B2, respectively, sidewall spacer portions 150B21 and 150B22 over side wall portions 140B31 and 140B32, respectively, and a lower portion 150B23 over lower oxide layer portion 140B33.

FIG. 3(I) depicts selectively etching back the spacer material layer (e.g., using a dry etchant 343) using the various oxide layer portions as etch stops to form sidewall spacer structures 150-21 and 150-22 inside emitter window 325E, and then removing (e.g., using HF 344) the oxide material layer portion disposed at lower end regions of emitter window 325E, thereby re-exposing the upper surface of contact portion 110A2 of SiGe layer 110A. Note that removing the oxide material forms the lower end region of emitter window 325E such that overhang regions 325E-1 and 325E-2 are formed under inside lower edges of sidewall spacer structures 150-21 and 150-22, respectively, that extend to inward-facing edges of oxide layer portions 140-331 and 140-332, respectively. In addition, a central opening region 325E-3 is formed that extends between overhang regions 325E-1 and 325E-2, and is located over contact portion 110A2 of SiGe layer 110A.

FIG. 3(J) depicts the subsequent deposition of standard in situ doped polysilicon 345 such that the resulting polysilicon layer 160A fills emitter window 325E and forms over layer nitride layer portion 150A11. Specifically, polycrystalline silicon 345 is deposited such that a lower emitter portion 160-1 entirely fills the lower end region of emitter window 325E and operably abuts contact portion 110A2 of SiGe layer 110A, a central (body) emitter portion 160-2 of the deposited polycrystalline silicon entirely fills the open space between sidewall spacer structures 150-21 and 150-22 and extends upward from contact emitter portion 160-1 to the upper opening of the emitter window 325E, and upper layer portions 160A31 and 160A32 extend outward from body portion 160-2 over nitride layer portions 150A12 and 15A-22. Note that lower emitter portion 160-1 fills the overhang regions formed below the lower inside edges of sidewall spacer structures 150-21 and 150-22 (i.e., overhang regions 325E-1 and 325E-2, indicated in FIG. 3(I)) such that lower emitter portion extends between the inward-facing edges of oxide layer portions 140-331 an 140-332.

FIG. 3(K) depicts patterning of the deposited polysilicon to form emitter structure 160. In the exemplary embodiment, an emitter mask 347 is formed that covers body portion 160-2 and extends outward over the polysilicon layer, and then one or more suitable etchants 348 are utilized to etch the exposed polycrystalline silicon, thereby forming upper emitter portions 160-31 and 160-32, and then to etch exposed portions of the underlying nitride-based dielectric layer, stopping at oxide layer portions 140A11 and 140A12. Oxide layer portions 140A11 and 140A12 are subsequently removed using a suitable wet etchant (not shown).

Figure 3L:
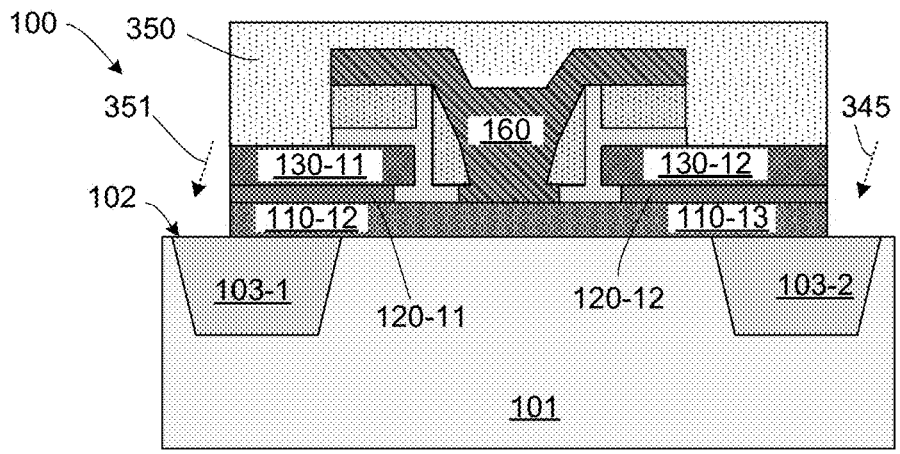

FIG. 3(L) depicts a subsequent base stack etching process by which the final base stack structures of HBT 100 are patterned. The base stack etch involves depositing and patterning a base stack mask 350 as shown, and then utilizing a suitable etchant 351 to remove exposed portions of the SiGe intrinsic base layer and Si extrinsic base material layer, thereby forming the final base stack structures including SiGe intrinsic base structure portions 110-11 and 110-12 and Si extrinsic base structures 130-11 and 130-12). In one embodiment the base stack etch is performed such that the intervening Ge layer portions (i.e., disposed between the removed SiGe and Si layer portions) is only a small perturbation in total stack etching process.

Figure 3M:
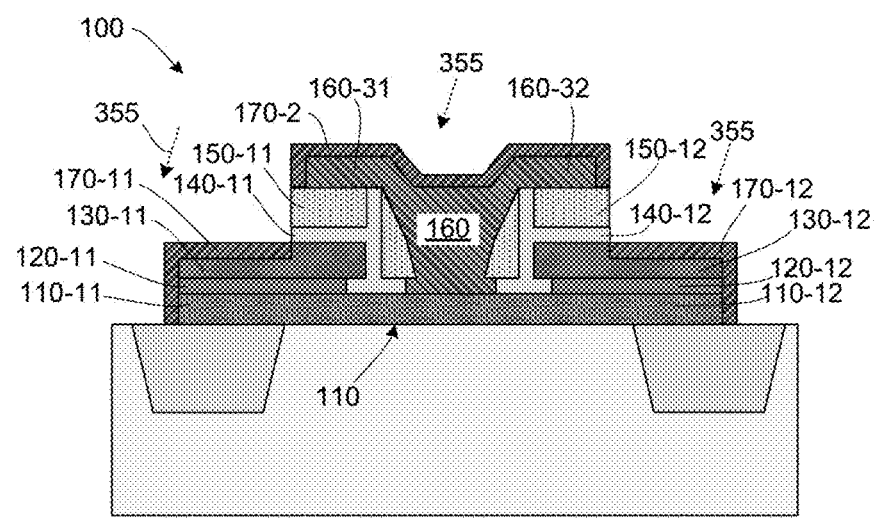

FIG. 3(M) illustrates HBT 100 subsequent to the formation of salicide structures 170-1 to 170-3 over the emitter and base structures in order to facilitate contact to SiGe HBT 100 using subsequent well-known backside metallization processes (not shown). Specifically, salicide structure 170-1 is formed by way of introducing suitable salicide material 355 over the exposed portion of Si intrinsic base structure 130-1 and extends down the side edge of the SiGe/Ge/Si stack to cover the side edge of SiGe intrinsic base structure portion 110-1. Similarly, salicide structure 170-2 is formed over the exposed portion of Si intrinsic base structure 130-2 and extends down the side edge of the SiGe/Ge/Si stack to cover the side edge of SiGe intrinsic base structure portion 110-2. Third salicide structure 170-3 is formed over the exposed upper portions of emitter structure 160 such that portions of the salicide material extend down the side edges of portions 160-31 and 160-32. According to an aspect of the invention, salicide structures 170-11, 170-12 and 170-2 are formed such that all remaining exposed surfaces of HBT 100 (i.e., other than the salicide material) are regular Si, whereby the present invention avoids issues associated with exposed Ge-based materials/layers.

Although the present invention has been described with respect to certain specific embodiments, it will be clear to those skilled in the art that the inventive features of the present invention are applicable to other embodiments as well, all of which are intended to fall within the scope of the present invention.

The invention claimed is:
1. A method for fabricating a heterojunction bipolar transistor (HBT) comprising:
sequentially forming a silicon-germanium (SiGe) layer, a substantially pure germanium (Ge) layer over the SiGe layer, and a silicon (Si) layer on the substantially pure Ge layer, wherein forming said substantially pure Ge layer comprises forming said Ge layer with a Ge concentration greater than 95%;
utilizing a dry etching process to form an emitter window by removing a portion of the Si layer using an underlying portion of the substantially pure Ge layer as an etch stop;
utilizing a wet etch process to remove said underlying portion of the substantially pure Ge layer, thereby exposing a contact portion of the SiGe layer in the emitter window; and
forming a polycrystalline silicon emitter structure that is at least partially disposed inside the emitter window such that a lower portion of the polycrystalline silicon emitter structure abuts the contact portion of the SiGe layer.

2. The method of claim 1, wherein sequentially forming said SiGe layer, said substantially pure Ge layer and said a Si layer comprises sequentially forming a single-crystal SiGe structure, a single-crystal Ge structure and a single-crystal Si structure.

3. The method of claim 1, wherein forming said SiGe layer comprises forming said SiGe layer such that a ratio of Si to Ge in said SiGe layer is less than 40%.

4. The method of claim 1, wherein forming said substantially pure Ge layer comprises forming said Ge layer with a thickness in the range of 2 nm to 100 nm.

5. The method of claim 1, wherein forming said Si layer comprises forming said Si layer with an n-type dopant having a concentration in the range of $1 \times 10^{18}$ to $1 \times 10^{20}$ atoms per cubic centimeter, and with a thickness in the range of 20 nm to 100 nm.

6. The method of claim 1, wherein said sequentially forming comprises maintaining said substrate in a reaction chamber while forming each of said SiGe layer, said substantially pure Ge layer and said Si layer.

7. The method of claim 6, wherein forming said SiGe layer comprises supplying a first gas and a second gas into said reaction chamber during a first time period, wherein forming said substantially pure Ge layer comprises supplying said second gas into said reaction chamber during a second time period, and wherein forming said Si layer comprises supplying said first gas into said reaction chamber during a third time period.

8. The method of claim 1, further comprising sequentially forming an oxide-based dielectric layer on the Si layer and a nitride-based dielectric layer on the oxide-based dielectric layer before removing said portion of the Si layer, whereby utilizing said dry etching process further includes removing corresponding portions of said nitride-based dielectric layer and said oxide-based dielectric layer.

9. The method of claim 8, wherein utilizing the drying etching process comprises performing a reactive ion etching (RIE) process.

10. The method of claim 1, wherein utilizing the wet etching process comprises entirely removing said underlying portion of the substantially pure Ge layer using $H_2O_2$.

11. The method of claim 1, wherein forming the polycrystalline silicon emitter structure includes:
depositing and patterning a spacer material inside the emitter window such that at least a portion of the contact portion of the SiGe layer is exposed through an opening defined in the spacer material; and
depositing polycrystalline silicon layer in and over the emitter window such that said lower portion occupies said opening defined in the spacer material, then patterning the polycrystalline silicon layer to form said emitter structure.

12. The method of claim 11, wherein depositing and patterning the spacer material comprises:
depositing an oxide material such that oxide layer portions are formed on the contact portion and wall surfaces inside the emitter window;
depositing one of a nitride-based spacer material and an α-Si spacer material on the oxide layer portions disposed inside the emitter window;
selectively etching said spacer material to form sidewall spacer structures inside the emitter window; and
removing said oxide material portion disposed on the contact portion of the SiGe layer such that an upper surface of said contact portion is exposed at a lower end of the sidewall spacer structures.

13. The method of claim 11, wherein depositing and patterning said polycrystalline silicon layer comprises:
depositing polycrystalline silicon such that a lower portion of the deposited polycrystalline silicon abuts said contact portion of the SiGe layer, a central portion of the deposited polycrystalline silicon extends from the contact portion to an upper opening of the emitter window, and upper portions of the deposited polycrystalline silicon that extend outward from the central portion; and
forming an emitter mask over the central portion of the deposited polycrystalline silicon; and
etching portions of the polycrystalline silicon exposed outside of the mask, whereby remaining portions of the polycrystalline silicon form the polycrystalline silicon emitter structure.

14. The method of claim 1, further comprising:
performing a base stack etch after forming said polycrystalline silicon emitter structure; and
forming at least one salicide structure such that said at least one salicide structure encapsulates all surfaces of said SiGe layer and said substantially pure Ge layer that are exposed after said base stack etch.

* * * * *